United States Patent
Rouh

(10) Patent No.: US 7,968,857 B2
(45) Date of Patent: Jun. 28, 2011

(54) APPARATUS AND METHOD FOR PARTIAL ION IMPLANTATION USING ATOM VIBRATION

(75) Inventor: Kyoung Bong Rouh, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 422 days.

(21) Appl. No.: 12/185,416

(22) Filed: Aug. 4, 2008

(65) Prior Publication Data

US 2009/0267002 A1    Oct. 29, 2009

(30) Foreign Application Priority Data

Apr. 29, 2008  (KR) .................. 10-2008-0040097

(51) Int. Cl.
*H01J 37/317*    (2006.01)
(52) U.S. Cl. .................................. 250/492.21
(58) Field of Classification Search ............ 250/492.21; 438/514, 535, 550
See application file for complete search history.

(56) References Cited

U.S. PATENT DOCUMENTS

| 6,111,260 A * | 8/2000 | Dawson et al. .......... 250/492.21 |
| 6,869,865 B2 * | 3/2005 | Maegawa et al. ............. 438/514 |
| 7,052,981 B2 | 5/2006 | Rouh et al. |

FOREIGN PATENT DOCUMENTS

| KR | 20-0134904 | 10/1998 |
| KR | 10-2005-0050658 | 5/2005 |
| KR | 10-2007-0086877 | 8/2007 |

* cited by examiner

*Primary Examiner* — Kiet T Nguyen
(74) *Attorney, Agent, or Firm* — Marshall, Gerstein & Borun LLP

(57) ABSTRACT

A partial ion implantation apparatus and method are provided. The partial ion implantation apparatus includes an ion beam generator, a wafer chuck, and a plurality of atom-vibrating devices. The ion beam generator is configured to generate an ion beam. The wafer chuck is disposed to support a wafer into which the ion beam is implanted. The atom-vibrating devices are configured to vibrate silicon atoms in the wafer.

16 Claims, 6 Drawing Sheets

APPARATUS AND METHOD FOR PARTIAL ION IMPLANTATION USING ATOM VIBRATION

CROSS-REFERENCE TO RELATED APPLICATIONS

The present application claims priority to Korean patent application number 10-2008-0040097, filed on Apr. 29, 2008, which is incorporated by reference in its entirety.

BACKGROUND OF THE INVENTION

The present invention relates to an ion implantation apparatus and method for fabrication of a semiconductor device, and more particularly, to an apparatus and method for partial ion implantation using atom vibrations.

In general, a plurality of unit processes must be performed to fabricate a semiconductor device, for example, a semiconductor memory device such as a dynamic random access memory (DRAM). Examples of the unit processes include a stacking process, an etching process, and an ion implantation process, which are performed on a wafer-by-wafer basis. The ion implantation process uses a strong electric field to accelerate dopant ions, such as boron and arsenic, to penetrate a wafer surface, thereby changing the electrical characteristics of the material.

In general, ions are implanted into a wafer by scanning an ion beam in the X-direction while moving the wafer in the Y-direction. However, when ion implantation is performed in the above manner, ions are implanted at about the same dose and energy throughout the entire region of a wafer. This is desirable when considered in terms of only an ion implantation process, but it is undesirable when considered in conjunction with other unit processes. That is, in performing several unit processes on a wafer, the process results are not uniform over the entire area of the wafer. For example, the etching degree and the thickness of a layer stacked on the wafer are not uniform over the entire wafer area. This may be not only because of the problem in the equipment for performing each unit process, but also because many parameters of each unit process cannot be accurately controlled.

As an example, in forming a gate electrode, a critical dimension (CD) representing the width of the gate electrode may differ depending on the locations in a wafer. For example, the CD of the gate electrode may be relatively large at the center of the wafer but relatively small at the edge of the wafer, and vise versa. If the CD of the gate electrode is larger at the center of the wafer than at the edge of the wafer, the threshold voltage of the device is higher at the center of the wafer than at the edge of the wafer. On the other hand, if the CD of the gate electrode is smaller at the center of the wafer than at the edge of the wafer, the threshold voltage of the device is lower at the center of the wafer than at the edge of the wafer.

As another example, in order to form a source/drain region of a lightly doped drain (LDD) structure, a spacer is formed on the side of a gate stack and then source/drain ion implantation is performed using the spacer as an ion implantation barrier layer. However, the thickness of the spacer cannot be uniform over the entire area of a wafer. Therefore, the LDD source/drain region has a profile non-uniform over the entire wafer surface, so that the characteristics of the resulting transistor are non-uniform depending on the locations in the wafer.

SUMMARY OF THE INVENTION

Embodiments of the present invention are directed to a partial ion implantation apparatus and method for implanting impurity ions into a wafer to different implantation depths depending on the respective regions of the wafer.

In one embodiment, a partial ion implantation apparatus may include: an ion beam generator configured to generate an ion beam; a wafer chuck disposed to support a wafer into which the ion beam is implanted; and a plurality of atom-vibrating devices configured to vibrate silicon atoms in the wafer.

The atom-vibrating devices may be disposed in the wafer chuck.

The atom-vibrating device may include at least one of a light-irradiating device, a heating device, and a wave-generating device. In this case, the light-irradiating device irradiates light with a long wavelength, a short wavelength, an ultra-long wavelength, or an ultra-short wavelength onto the wafer. The heating device may transfer heat of relatively low temperature, for example, below approximately 210° C. to the wafer. The wave-generating device may transfer an ultrasonic wave or a megasonic wave to the wafer.

The partial ion implantation apparatus may further include a controller configured to drive the atom-vibrating devices including driving them separately.

In another embodiment, a partial ion implantation method may include: selectively vibrating silicon atoms of a wafer with respect to a partial region of the wafer; and irradiating an ion beam onto the wafer such that the depth-dependent concentration profile of impurity ions in the partial region where the silicon atoms are vibrated is different from the depth-dependent concentration profile of impurity ions in the other region of the wafer.

The selective vibrating of the silicon atoms may include irradiating light onto the partial region of the wafer.

The selective vibrating of the silicon atoms may include applying heat to the partial region of the wafer.

The selective vibrating of the silicon atoms may include transferring a wave to the partial region of the wafer.

In still another embodiment, a partial ion implantation method may include: implanting inert gas into a wafer; vibrating the inert gas and silicon atoms in a partial region of the wafer; and irradiating an ion beam onto the wafer such that the depth-dependent concentration profile of impurity ions in the partial region where the silicon atoms and the inert gas are vibrated is different from the depth-dependent concentration profile of impurity ions in the other region of the wafer.

The inert gas may include at least one of He, Ne, Ar, Kr, Xe, and Rn.

In still another embodiment, a partial ion implantation method may include: vibrating silicon atoms in a wafer in such a way that the vibration intensity of the silicon atoms in a partial region of the wafer is different from the vibration intensity of the silicon atoms in the other region of the wafer; and irradiating an ion beam onto the wafer such that the depth-dependent concentration profile of impurity ions in the partial region of the wafer is different from the depth-dependent concentration profile of impurity ions in the other region of the wafer.

The partial ion implantation method may further include implanting inert gas into the wafer before the vibrating of the silicon atoms in the wafer. In this case, the inert gas may include at least one of He, Ne, Ar, Kr, Xe, and Rn.

DESCRIPTION OF SPECIFIC EMBODIMENTS

Hereinafter, an apparatus and method for partial ion implantation using atomic vibrations in accordance with the present invention will be described in detail with reference to the accompanying drawings.

Figure 1:
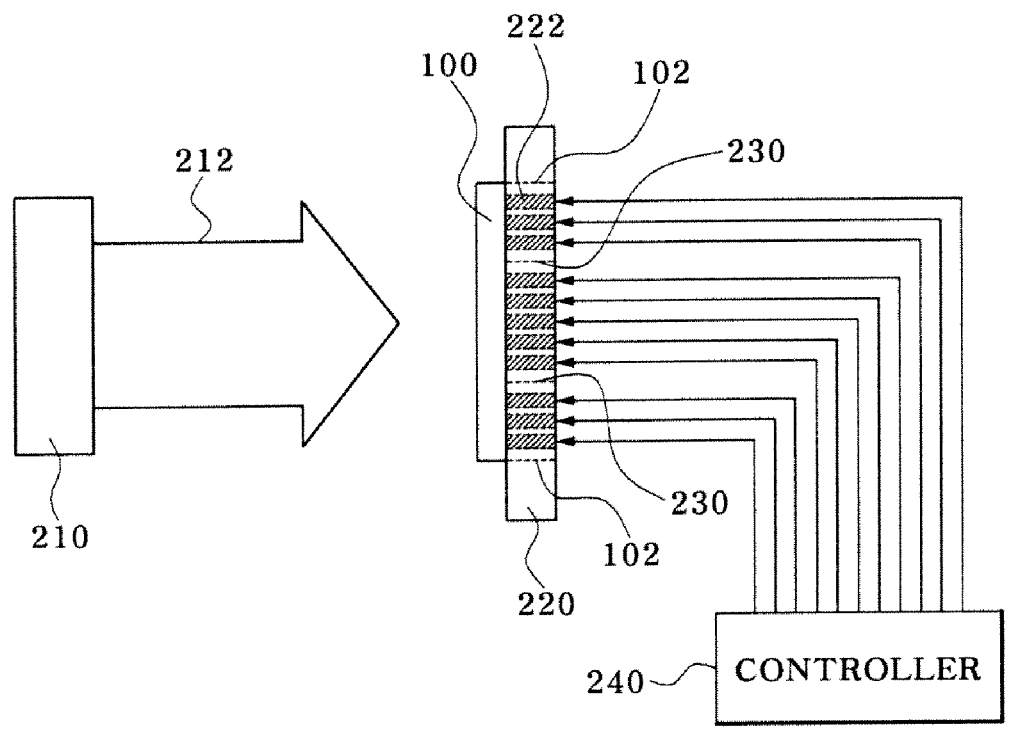
FIG. 1 illustrates an example of a partial ion implantation apparatus according to an embodiment of the present invention.
Figure 2:
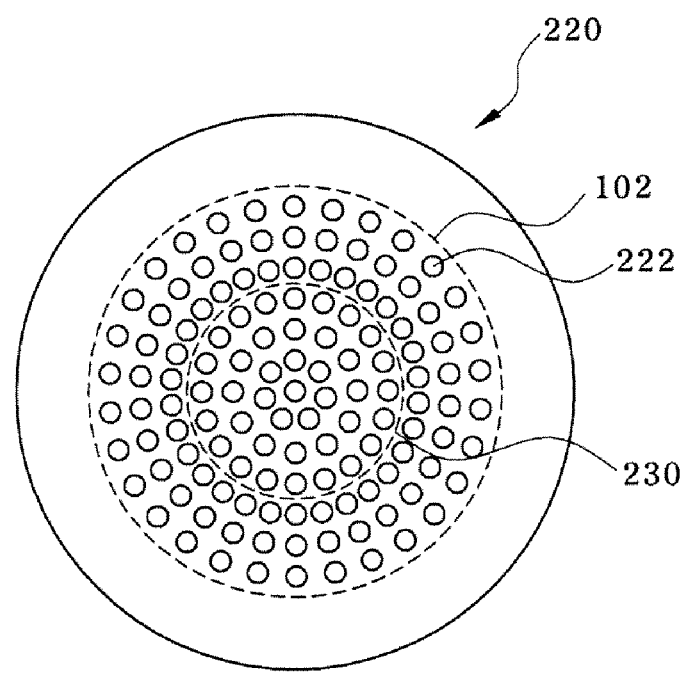
FIG. 2 illustrates a detailed view of a wafer chuck illustrated in FIG. 1.

FIG. 1 illustrates an example of a partial ion implantation apparatus according to an embodiment of the present invention. FIG. 2 illustrates a detailed view of a wafer chuck illustrated in FIG. 1.

Referring to FIGS. 1 and 2, a partial ion implantation apparatus according to an embodiment of the present invention includes an ion beam generator 210 and a wafer chuck 220. The ion beam generator 210 generates an ion beam 212, and the wafer chuck 220 supports a wafer 100 into which the ion beam 212 is implanted. A plurality of atom-vibrating devices 222 capable of vibrating silicon atoms in the wafer 100 are disposed in the wafer chuck 220. Although not illustrated in the drawings, various devices (e.g. an ion beam accelerator) for controlling the ion beam 121 may be disposed between the ion beam generator 210 and the wafer chuck 220. The present embodiment exemplifies a case where the atom-vibrating devices 222 are disposed in the wafer chuck 220. However, it will be apparent to those skilled in the art that the atom-vibrating devices 222 may be disposed at other positions according to circumstances. For example, the atom-vibrating devices 222 may be disposed around the wafer 100.

The atom-vibrating devices 222 disposed in the wafer chuck 220 may be separately driven, so that the vibration of silicon atoms may be induced partially with respect to a portion of the wafer 100 corresponding to an upper portion of the wafer chuck 220. That is, the vibration of silicon atoms may be induced with respect to a predetermined region of the wafer 100, whereas the vibration of silicon atoms may not be induced with respect to the other region of the wafer 100. In another embodiment, the vibration of silicon atoms may be induced with respect to the entire region of the wafer in such a way that the vibration of silicon atoms is strongly induced with respect to a predetermined region of the wafer 100, whereas the vibration of silicon atoms is weakly induced with respect to the other region of the wafer 100. For the partial atom vibration, the atom-vibrating devices 222 may be separately driven by a controller 240. The controller 240 may include a power unit (not illustrated) for driving the atom vibration devices 222. In an embodiment, the atom-vibration device 222 may be implemented using a light-irradiating device. In this case, the atom-vibrating device 222 may irradiate light with a long wavelength, a short wavelength, an ultra-long wavelength, or an ultra-short wavelength onto the wafer 100. In another embodiment, the atom-vibrating device 222 may be implemented using a heating device. In this case, the atom-vibrating device 222 may transfer heat of relatively low temperature (e.g., below approximately 210° C.), which does not affect other material layer (e.g., a photoresist layer) on the wafer 100, to the wafer 100. In still another embodiment, the atom-vibrating device 222 may be implemented using a wave-generating device. In this case, the atom-vibrating device 222 may transfer an ultrasonic wave or a megasonic wave to the wafer 100. According to circumstances, the atom-vibrating device 222 may be implemented using a combination of at least two of a light-irradiating device, a heating device, and a wave-generating device. In any case, when inert gas such as He, Ne, Ar, Kr, Xe, and Rn is implanted into the wafer 100 before the driving of the atom-vibrating devices 222, the implanted inert gas can also be vibrated by the subsequent driving of the atom-vibrating devices 222.

Figure 3:
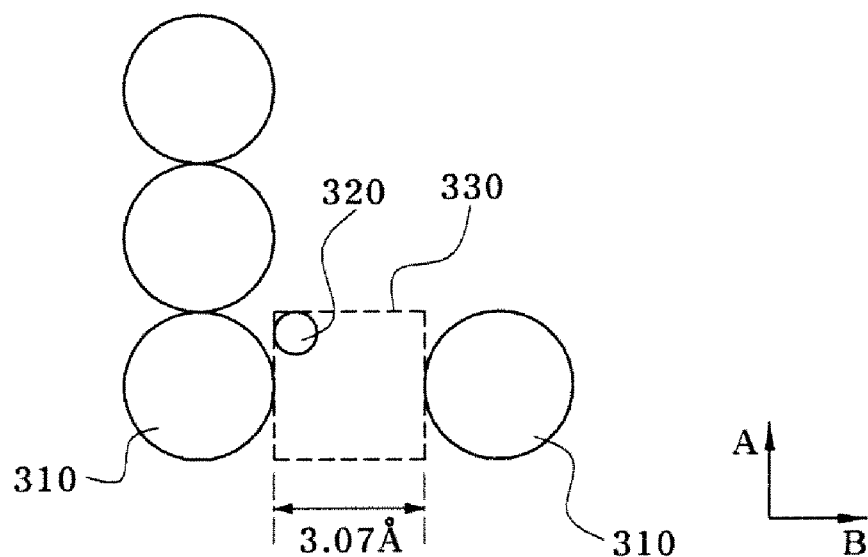
FIGS. 3 and 4 illustrate the influence of impurity ions implanted by atom vibration in accordance with an embodiment of the invention.
Figure 4:
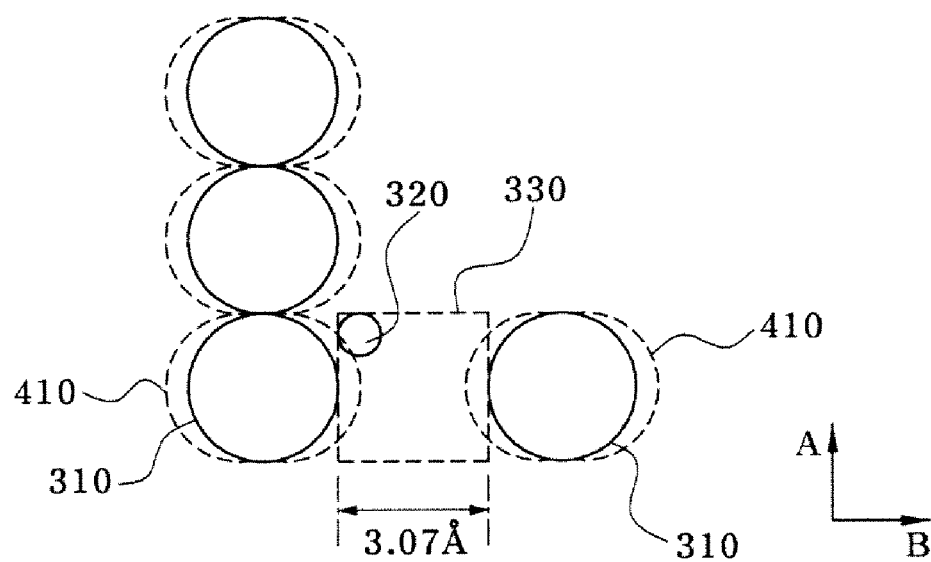

FIGS. 3 and 4 illustrate the influence of impurity ions implanted by atom vibration.

As illustrated in FIG. 3, silicon atoms 310 in a silicon wafer with a typical silicon lattice structure are disposed in such a way that they are adjacent to each other in the closest direction (i.e., in an A-direction) but are spaced apart from each other by a predetermined distance in another direction (e.g., in a B-direction). Impurity ions 320 implanted into the silicon wafer pass through the empty space between the silicon atoms 310. The distance between the silicon atoms 310 in the B-direction is approximately 3.07 Å. For example, boron (B) ions may be used as the impurity ions 320 to be implemented. In this case, because the boron (B) ion has a diameter of approximately 0.36 Å, approximately 44.48 number of boron (B) ions 320 can pass through the empty space between the silicon atoms 310, i.e., the space of a square 330 with a side of approximately 3.07 Å. The boron (B) ions 320 passing through the empty space between the silicon atoms 310 are implanted more deeply than boron (B) ions 320 colliding with the silicon atoms 310. The deeply-implanted boron (B) ions 320 mainly cause a channeling phenomenon that deforms an impurity concentration profile.

On the other hand, when the silicon atoms 310 are vibrated as indicated by dotted lines 410 in FIG. 4, the distance between the silicon atoms 310 is reduced by the vibration of the silicon atoms 310. Consequently, the number of boron (B) ions 320 passing through the empty space between the silicon atoms 310 decreases, whereas the number of boron (B) ions 320 colliding with the silicon atoms 310 increases. Thus, the vibration of the silicon atoms 310 suppresses the channeling phenomenon of the boron (B) ions 320 (i.e., the impurity ions) passing through the empty space between the silicon atoms 310.

Figure 5:
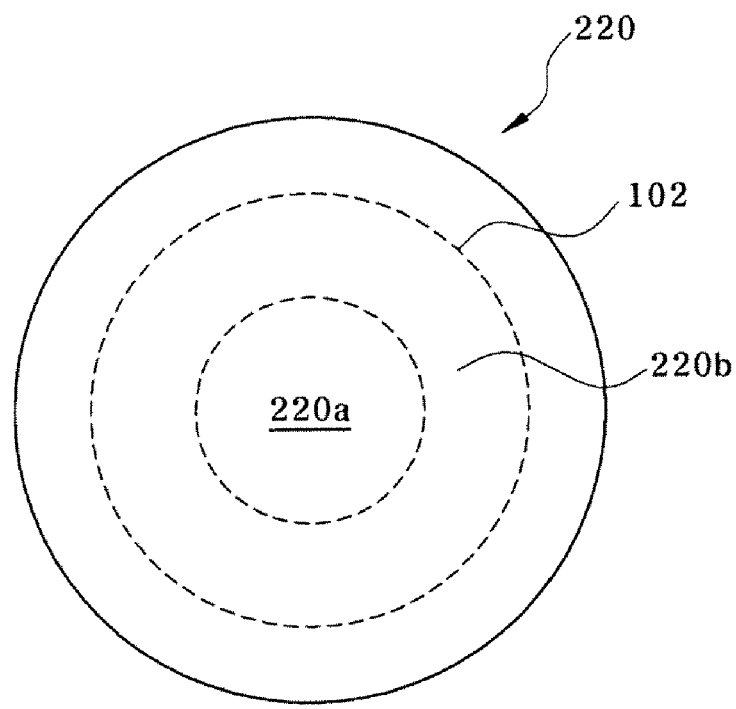
FIGS. 5 and 6 illustrate a partial ion implantation method according to an embodiment of the present invention.
Figure 6:
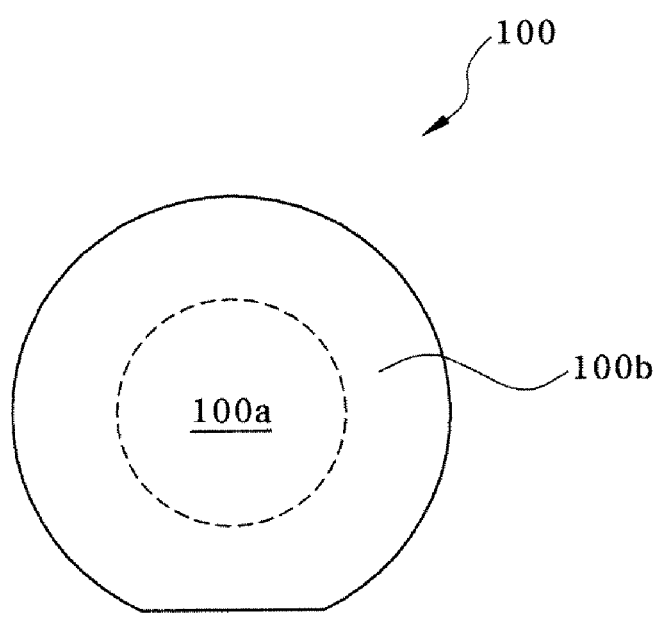

FIGS. 5 and 6 illustrate a partial ion implantation method according to an embodiment of the present invention. FIG. 5 illustrates the wafer chuck 220, and FIG. 6 illustrates the wafer 100.

Referring to FIGS. 5 and 6, a region 102 of the wafer chuck 220, on which the wafer 100 is to be mounted, is divided into an inner region 220a and an outer region 220b. The inner region 220a and the outer region 220b of the wafer chuck 220 overlap respectively with a first region 110a and a second region 110b of the wafer 100. The present embodiment defines the first region 110a and the second region 110b of the wafer 100 respectively as a center region and an edge region of the wafer 100. However, it will be apparent to those skilled in the art that the first region 110a and the second region 110b of the wafer 100 may be defined respectively as other regions of the wafer 100 according to circumstances. For example, the first region 110a and the second region 110b of the wafer 100 may be defined respectively as an upper region and a lower region of the wafer 100. The first region 110*a* and the second region 110*b* of the wafer 100 are different in transistor characteristics such as threshold voltages. Thus, it is necessary that the implantation depth of impurity ions implanted into the first region 110*a* is set to be different from the implantation depth of impurity ions implanted into the second region 110*b*. The present embodiment exemplifies a case where the implantation depth of impurity ions in the first region 110*a* is greater than the implantation depth of impurity ions in the second region 110*b*. In this case, among the atom-vibrating devices 222 in the wafer chuck 220 (see FIGS. 1 and 2), the atom-vibrating devices 222 in the inner region 220*a* are driven but the atom-vibrating devices 222 in the outer region 220*b* are not driven. This selective driving of the atom-vibrating devices 222 is controlled by the controller 240 (see FIG. 1) that drives the atom-vibrating devices 222 separately.

The present embodiment exemplifies a case where the atom-vibrating devices 222 in the outer region 220*b* are not driven. However, the atom-vibrating devices 222 in the outer region 220*b* may also be driven according to circumstances. In this case, the driving power for the atom-vibrating devices 222 in the inner region 220*a* is set to be different from the driving power for the atom-vibrating devices 222 in the outer region 220*b*. Due to the different driving power for the respective regions, the vibration intensity of silicon atoms in the first region 100*a* of the wafer 100 corresponding to the inner region 220*a* of the wafer chuck 220 becomes different from the vibration intensity of silicon atoms in the second region 100*b* of the wafer 100 corresponding to the outer region 220*b* of the wafer chuck 220. When impurity ion implantation is performed under the above condition, the concentration profiles depending on the depths of the impurity ions in the first region 100*a* and the second region 100*b* of the wafer 100 become different from each other.

Figure 7:
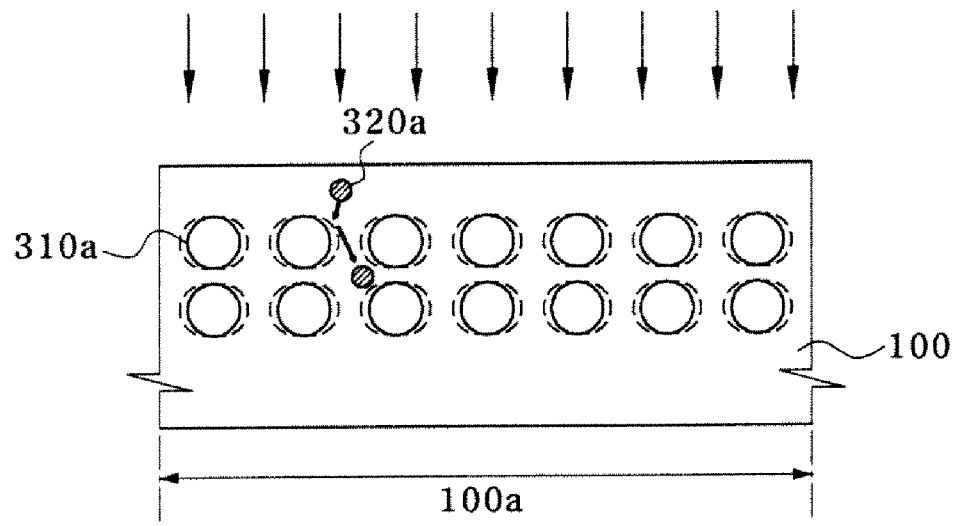
FIGS. 7 and 8 illustrate an example of impurity ion implantation processes in a first region and a second region of a wafer illustrated in FIG. 6.
Figure 8:
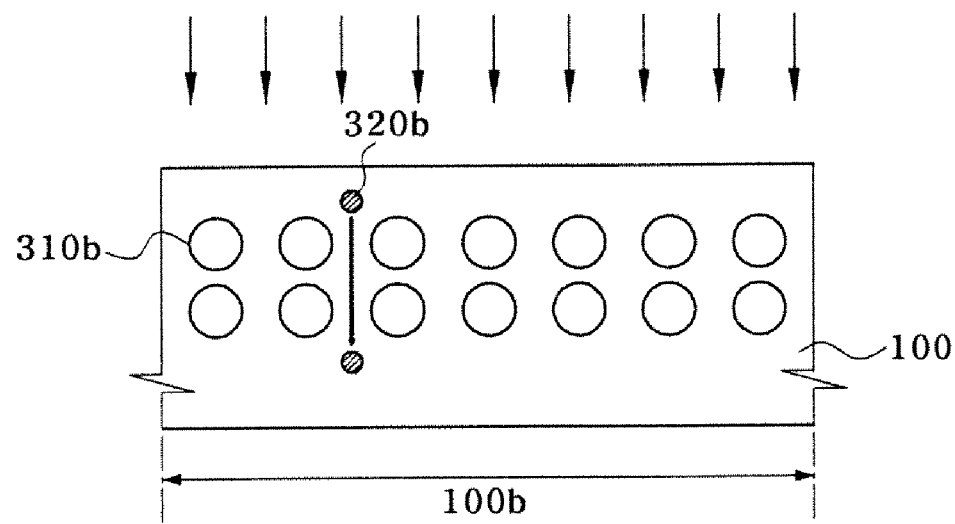

FIGS. 7 and 8 illustrate an example of impurity ion implantation processes in the first region 100*a* and the second region 100*b* of the wafer 100 illustrated in FIG. 6.

Referring to FIG. 7, among the atom-vibrating devices 222 (see FIGS. 1 and 2) in the wafer chuck 220 (see FIG. 5), the atom-vibrating devices 222 in the inner region 220*a* are driven. Thus, silicon atoms 310*a* in the first region 100*a* of the wafer 100 are vibrated as indicated by dotted lines in FIG. 7. Therefore, some of the implanted impurity ions 320*a* pass through the space between the silicon atoms 310*a*, whereas others collide with the silicon atoms 310*a* and are thus located in the empty space between the silicon atoms 310*a*. In this case, the number of the impurity ions 320*a* colliding with the silicon atoms 310*a* increases but the number of the impurity ions 320*a* passing through the space between the silicon atoms 310*a* decreases, in comparison with the case where the silicon atoms 310*a* are not vibrated. Thus, the implantation depth of the impurity ions 320*a* in the first region 100*a* of the wafer 100 decreases.

Referring to FIG. 8, among the atom-vibrating devices 222 (see FIGS. 1 and 2) in the wafer chuck 220 (see FIG. 5), the atom-vibrating devices 222 in the outer region 220*b* are not driven. Thus, silicon atoms 310*b* in the second region 100*b* of the wafer 100 are not vibrated artificially. Also in this case, some of the implanted impurity ions 320*b* pass through the space between the silicon atoms 310*b*, whereas others collide with the silicon atoms 310*b* and are thus located in the empty space between the silicon atoms 310*b*. However, the number of the impurity ions 320*b* passing through the space between the silicon atoms 310*b* increases, in comparison with the case where the silicon atoms 310*b* are vibrated. Thus, the implantation depth of the impurity ions 320*b* in the second region 100*b* of the wafer 100 increases.

Figure 9:
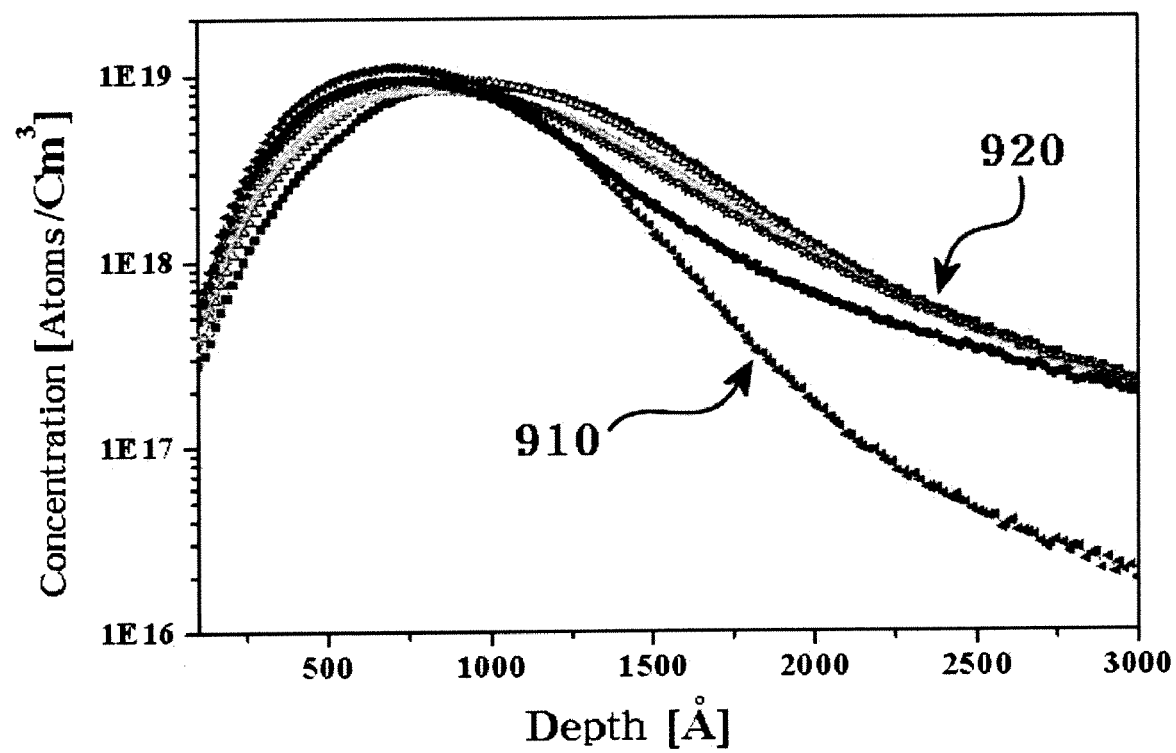
FIG. 9 illustrates a graph showing the concentration distributions of implanted impurity ions depending on the occurrence/non-occurrence of atom vibrations.

FIG. 9 illustrates a graph showing the concentration distributions of implanted impurity ions depending on the occurrence/non-occurrence of atom vibrations. In FIG. 9, a curve denoted by a reference numeral 910 represents the concentration distribution of impurity ions in the first region 100*a* (see FIG. 6) of the wafer 100, i.e., the region where atom vibration occurs, and a curve denoted by a reference numeral 920 represents the concentration distribution of impurity ions in the second region 100*b* (see FIG. 6) of the wafer 100, i.e., the region where atom vibration does not occur. As illustrated in FIG. 9, atom vibration occurs in the first region 100*a* (see FIG. 6) of the wafer 100 and thus the channeling phenomenon of the impurity ions passing through the space between the silicon atoms is suppressed, so that the first region 100*a* has a relatively low concentration at a depth of approximately 2000 Å or more. On the other hand, atom vibration does not occur in the second region 100*b* (see FIG. 6) of the wafer 100 and thus the channeling phenomenon occurs relatively easily, so that the second region 100*b* has a relatively high concentration at a depth of approximately 2000 Å or more. Thus, it can be seen that the wafer region where ion vibration occurs can have a different impurity ion concentration distribution than the wafer region where ion vibration does not occur.

Figure 10:
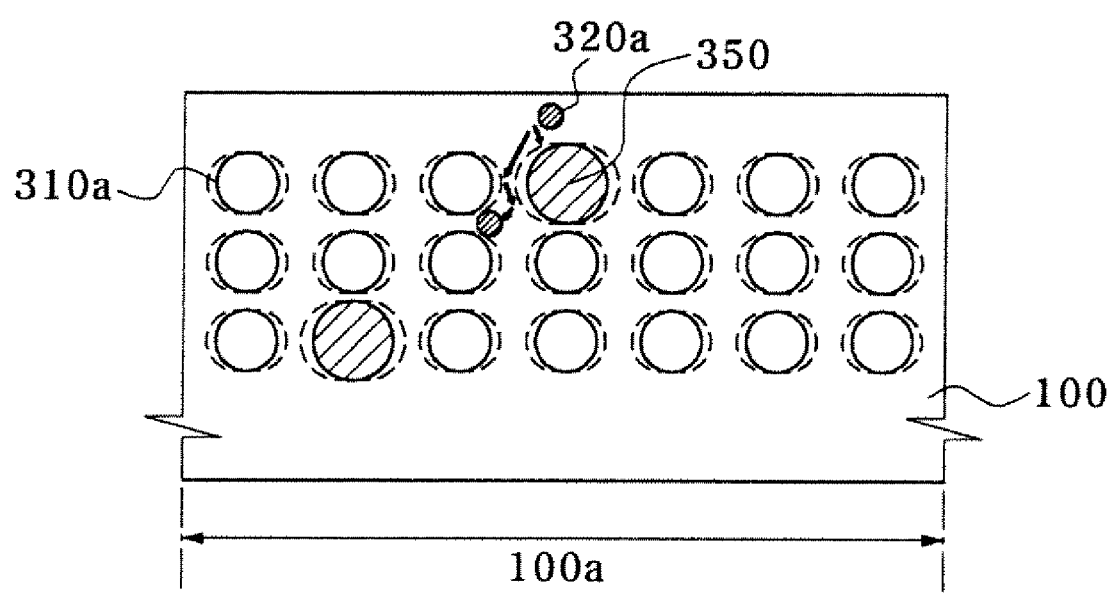
FIG. 10 illustrates another example of an impurity ion implantation process in the first region of the wafer illustrated in FIG. 6.

FIG. 10 illustrates another example of an impurity ion implantation process in the first region 100*a* of the wafer 100 illustrated in FIG. 6. According to this embodiment, the impurity ion implantation process in the first region 100*a* of the wafer 100 further includes implanting inert gas 350 into the wafer 100 before generating atom vibrations in the first region 100*a* of the wafer 100. The amount of inert gas implanted is sufficient to the extent that the vibration of the inert gas increases the probability of suppressing the channeling of impurity ions. The inert gas may be uniformly implanted over the entire area of the wafer 100, or may be selectively implanted into only the first region 100*a*, i.e., the atom vibration target region of the wafer 100. The inert gas 350 may include at least one of He, Ne, Ar, Kr, Xe, and Rn. The implanted inert gas 350 is disposed between silicon atoms 310*a* while pushing out the silicon atoms 310*a*.

After the inert gas 350 is implanted, the atom-vibrating devices 222 in the inner region 220*a* among the atom-vibrating devices 222 (see FIGS. 1 and 2) in the wafer chuck 220 (see FIG. 5) are driven. Then, the inert gas 350 and the silicon atoms 310*a* in the first region 100*a* of the wafer 100 are vibrated as indicated by dotted lines in FIG. 10. Thus, some of the implanted impurity ions 320*a* pass through the space between the silicon atoms 310*a*, whereas others collide with the silicon atoms 310*a* and the inert gas 350 and are thus located in the empty space between the silicon atoms 310*a* or the empty spaces between the silicon atom 310*a* and the inert gas 350. In this case, the number of the impurity ions 320*a* colliding with the silicon atoms 310*a* and the inert gases 350 increases, in comparison with the case where the silicon atoms 310*a* are not vibrated or the case where only the silicon atoms 310*a* are vibrated. The operation of the other region of the wafer 100 where atom vibration does not occur is the same as described with reference to FIG. 8.

As described above, the present invention can implant impurity ions into the wafer in such a way that the depth-dependent concentration profiles of the impurity ions are different depending on the respective regions of the wafer. Therefore, it is possible to reduce the non-uniformity of the characteristic distribution over the entire wafer area, for example, the non-uniformity of the distribution of drain-induced barrier lowering (DIBL), which is caused by an increase in the device integration level.

While the present invention has been described with respect to the specific embodiments, it will be apparent to those skilled in the art that various changes and modifications may be made without departing from the spirit and scope of the invention as defined in the following claims.

What is claimed is:

1. A partial ion implantation apparatus comprising:
   an ion beam generator configured to generate an ion beam;
   a wafer chuck disposed to support a wafer into which the ion beam is implanted; and
   a plurality of atom-vibrating devices configured to vibrate silicon atoms in the wafer and to be separately driven so that the vibration of silicon atoms may be induced partially with respect to a portion of the wafer.

2. The partial ion implantation apparatus of claim 1, wherein the atom-vibrating devices are disposed in the wafer chuck.

3. The partial ion implantation apparatus of claim 1, wherein the atom-vibrating device comprises at least one of a light-irradiating device, a heating device, and a wave-generating device.

4. The partial ion implantation apparatus of claim 3, wherein the light-irradiating device irradiates light with a long wavelength, a short wavelength, an ultra-long wavelength, or an ultra-short wavelength onto the wafer.

5. The partial ion implantation apparatus of claim 3, wherein the heating device transfers heat of low temperature below approximately 210° C. to the wafer.

6. The partial ion implantation apparatus of claim 3, wherein the wave-generating device transfers an ultrasonic wave or a megasonic wave to the wafer.

7. The partial ion implantation apparatus of claim 1, further comprising a controller configured to drive the atom-vibrating devices separately.

8. A partial ion implantation method comprising:
   selectively vibrating silicon atoms of a wafer with respect to a partial region of the wafer; and
   irradiating an ion beam onto the wafer such that the depth-dependent concentration profile of impurity ions in the partial region where the silicon atoms are vibrated is different from the depth-dependent concentration profile of impurity ions in the other region of the wafer.

9. The partial ion implantation method of claim 8, wherein the selective vibrating of the silicon atoms comprises irradiating light onto the partial region of the wafer.

10. The partial ion implantation method of claim 8, wherein the selective vibrating of the silicon atoms comprises applying heat to the partial region of the wafer.

11. The partial ion implantation method of claim 8, wherein the selective vibrating of the silicon atoms comprises transferring a wave to the partial region of the wafer.

12. A partial ion implantation method comprising:
   implanting inert gas into a wafer;
   vibrating the inert gas and silicon atoms in a partial region of the wafer; and
   irradiating an ion beam onto the wafer such that the depth-dependent concentration profile of impurity ions in the partial region where the silicon atoms and the inert gas are vibrated is different from the depth-dependent concentration profile of impurity ions in the other region of the wafer.

13. The partial ion implantation method of claim 12, wherein the inert gas comprises at least one of He, Ne, Ar, Kr, Xe, and Rn.

14. A partial ion implantation method comprising:
   vibrating silicon atoms in a wafer in such a way that the vibration intensity of the silicon atoms in a partial region of the wafer is different from the vibration intensity of the silicon atoms in the other region of the wafer; and
   irradiating an ion beam onto the wafer such that the depth-dependent concentration profile of impurity ions in the partial region of the wafer is different from the depth-dependent concentration profile of impurity ions in the other region of the wafer.

15. The partial ion implantation method of claim 14, further comprising implanting inert gas into the wafer before the vibrating of the silicon atoms in the wafer.

16. The partial ion implantation method of claim 15, wherein the inert gas comprises at least one of He, Ne, Ar, Kr, Xe, and Rn.

* * * * *